United States Patent [19]

Kitson

[11] Patent Number: 5,267,545
[45] Date of Patent: Dec. 7, 1993

[54] METHOD AND APPARATUS FOR CONTROLLING THE OPERATION OF A SOLENOID

[75] Inventor: Mark R. Kitson, Kingsley, Australia

[73] Assignee: Orbital Engine Company (Australia) Pty. Limited, Balcatta, Australia

[21] Appl. No.: 5,407

[22] Filed: Jan. 19, 1993

Related U.S. Application Data

[63] Continuation of Ser. No. 776,358, Nov. 19, 1991, abandoned.

[30] Foreign Application Priority Data

May 19, 1989 [AU] Australia ............................. PJ4264
Jun. 15, 1989 [AU] Australia ............................. PJ4728

[51] Int. Cl.$^5$ ............................................ F02M 51/00
[52] U.S. Cl. ................................................. 123/490
[58] Field of Search ............... 123/490, 478, 480, 486, 123/487; 361/152, 159, 153, 154; 323/222

[56] References Cited

U.S. PATENT DOCUMENTS

| | | | |
|---|---|---|---|
| 2,461,321 | 2/1949 | Guillemin | 123/490 |
| 3,682,144 | 8/1972 | Suda | 123/490 |
| 4,292,948 | 10/1981 | Graesslay | 123/490 |
| 4,295,177 | 10/1981 | Woodhouse et al. | 123/490 |
| 4,327,692 | 5/1982 | Harsch et al. | 123/490 |
| 4,327,695 | 5/1982 | Schechter | 123/504 |
| 4,345,296 | 8/1982 | Brotling | 361/154 |
| 4,347,544 | 8/1982 | Ohba | 361/154 |
| 4,492,913 | 1/1985 | Arnold et al. | 323/282 |
| 4,764,840 | 8/1988 | Petrie et al. | 361/154 |
| 4,933,805 | 6/1990 | Calfins | 361/152 |
| 4,950,974 | 8/1990 | Pagano | 323/222 |
| 4,953,056 | 8/1990 | Yakuwa et al. | 361/154 |
| 5,053,911 | 10/1991 | Kopce et al. | 361/154 |

FOREIGN PATENT DOCUMENTS

| | | |
|---|---|---|
| 0008509 | 3/1980 | European Pat. Off. |
| 1507239 | 4/1978 | United Kingdom |
| 2015843 | 9/1979 | United Kingdom |
| 2025183 | 1/1980 | United Kingdom |
| 2104664 | 3/1983 | United Kingdom |
| 2107495 | 4/1983 | United Kingdom |
| 2137773 | 10/1984 | United Kingdom |

Primary Examiner—Raymond A. Nelli
Attorney, Agent, or Firm—Nikaido, Marmelstein, Murray & Oram

[57] ABSTRACT

A method of controlling the operation of a solenoid comprising supplying current to the solenoid winding from an electrical source and controlling the rate of rise of the current at a predetermined rate during at least the period between initiation of the current supply and the commencement of movement of the solenoid armature, said predetermined rate of rise of the current being independent of the maximum rate of rise of the current attainable at the nominal voltage of the electrical source.

19 Claims, 3 Drawing Sheets

METHOD AND APPARATUS FOR CONTROLLING THE OPERATION OF A SOLENOID

This application is a continuation of application Ser. No. 07/776,358 filed Nov. 19, 1991.

The present invention relates to a method and apparatus for controlling the operation of a solenoid and in particular, the solenoid of a fuel injector of an internal combustion engine.

In a fuel injected internal combustion engine, it is known to use solenoids to actuate the valve of a fuel injector to selectively or cyclically open the valve for delivery of fuel to the engine for a selected time within the engine cycle. The effective operation of the engine is to a degree dependent upon the accuracy of the delivery valves being opened at the selected time and for the period within the engine cycle.

It is well known that during the operating cycle of a solenoid, the solenoid draws energy from an electrical supply and the current drawn follows a characteristic course during the operation of the solenoid. In particular, the current initially rises progressively to a current value sufficient for the armature to complete its movement, then the current falls to and maintains a substantially constant holding current value until the electrical supply is switched off to permit the armature to return.

During the energisation of the solenoid, the rate of rise of the solenoid current is naturally dependent upon the actual value of the supply voltage in the electrical system. However, under operating conditions normally encountered in internal combustion engine operation, the actual value of the supply voltage may vary from the nominal value of the supply voltage. The supply voltage is normally provided by a storage battery and can therefore vary significantly, dependent on the state of charge of the battery. Further, the impedance of the solenoid and of other electrical components in the electrical system for the engine may also vary under operating conditions, for example, with temperature, and therefore effect the current within the solenoid actuating the delivery valve.

In the light of the increasing demand for a reduction in the level of undesirable contaminants in engine exhaust gas, such as the level of hydrocarbons, nitrous oxide and carbon dioxide, the required level of accuracy in the delivery of fuel to an engine is also increasing. Apart from the quantity of fuel delivered to the engine, other factors which must be strictly controlled are the timing of the commencement of the delivery of fuel to the engine in relation to the engine cycle and the time period over which the fuel is delivered to the engine. This control is required to not only apply in respect of each individual delivery, but is also required to apply in regard to the relationship of deliveries to respective cylinders of the engine, and also in relation to respective deliveries to the same cylinder.

It is relatively simple to provide a suitable programmed processor to set the time of the commencement of the supply of electric energy to a solenoid operating the delivery valve of a fuel injector, and to set the period that the energy is supplied thereto. However, for the reasons above discussed, there is a delay period between the initial connection of the solenoid to the energy source and the time of actual commencement of opening of the valve, and a further delay for the valve reaching the fully open position. Also due to the same factors, there can be a significant variation in the time interval between applying the energy and the attainment of full opening of the delivery valve between delivery valves in respective cylinders of the same engine as the voltage supply to the injectors of the respective cylinders may vary.

It will therefore be appreciated that it is not acceptable to incorporate in the program of the processor controlling the operation of the fuel injectors a fixed delay period between initial application of electrical energy to the solenoid and the actual opening of the delivery valve as a means of compensating for the time taken the valve to reach the fully open position. The provision of such a fixed correction or a correction modified for different supply voltages have been the accepted practice in the past and as a consequence there have been adverse effects on the control of the combustion process due to inaccuracies and variations in the actual timing of the commencement and duration of the delivery of the fuel to the engine on a cycle to cycle basis and a cylinder to cylinder basis.

It is therefore the object of the present invention to provide a method and apparatus for controlling the operation of a solenoid actuated fuel delivery valve of an internal combustion engine fuel injector system so as to provide improved accuracy in the control of the fuel delivery function and so improve the control of exhaust emissions.

With this object in view, there is provided according to the present invention a method of controlling the operation of a solenoid actuating the fuel delivery valve of a fuel injector of an internal combustion engine comprising supplying current to the solenoid winding from an electrical source of a nominal voltage and controlling the rate of rise of the current at a predetermined rate during the period between initiation of the current supply and at least the commencement of movement of the solenoid armature to open the delivery valve, said predetermined rate of rise of the current being independent of the maximum rate attainable at said nominal voltage.

Conveniently the rate of rise of the current is controlled so as to be substantially linear substantially throughout the period between the initiation of the current supply and the commencement of the movement of the armature of the solenoid. Preferably the control of the current extends beyond the commencement of movement of the armature so as to be maintained until the armature has completed the full extent of the movement required to move the delivery valve of the fuel injector to the fully open position.

As is conventional practice in the operation of a solenoid after the armature has completed the full extent of its movement and hence the current in the coil has reached saturation, the current is permitted to decay to a value which is sufficient to hold the armature in the fully opened position. Normally this decay of the current is effected as rapidly as possible and is customarily achieved by the use of a Zener circuit.

Preferably the rate of rise of the current from the initial application thereof until the commencement of movement of the armature is monitored and the supply voltage is cyclically varied to maintain the required predetermined rate of rise of the current. The monitoring is effected by providing a reference current which rises at a rate corresponding to the predetermined rate set for the solenoid current. The supply current is compared with the reference current and the supply voltage of the current to the solenoid is varied in response to the result of the comparison to maintain the current supplied to the solenoid arising at the same rate as the reference current.

The current control can be achieved by cyclically varying the supply voltage and provision may be made for monitoring a characteristic of the cyclic variation of the current supplied to the solenoid and through this monitoring there can be detected variations in the frequency of the cycling. A sudden change in the frequency indicates that the armature of the solenoid has completed its movement causing a change in the inductance of the solenoid coil, and hence a change in the rate of rise of the current flowing therein. This information that the armature has completed its movement also means that the delivery valve of the fuel injector is fully open and thus the processor controlling the operation of the fuel injector can control the open period of the delivery valve from this datum.

In the preceding description, specific reference has been made to the control of a solenoid arranged to actuate the delivery valve of a fuel injector. It is, however, to be understood that the control of the operation of a solenoid as herein described, is applicable to solenoids in many other applications, particularly where the control of the timing of the period of operation of the solenoid is relevant.

The invention will be more readily understood from the following description of one practical arrangement of the method of controlling a solenoid as illustrated in, and with reference to, the accompanying drawings.

Figure 1:
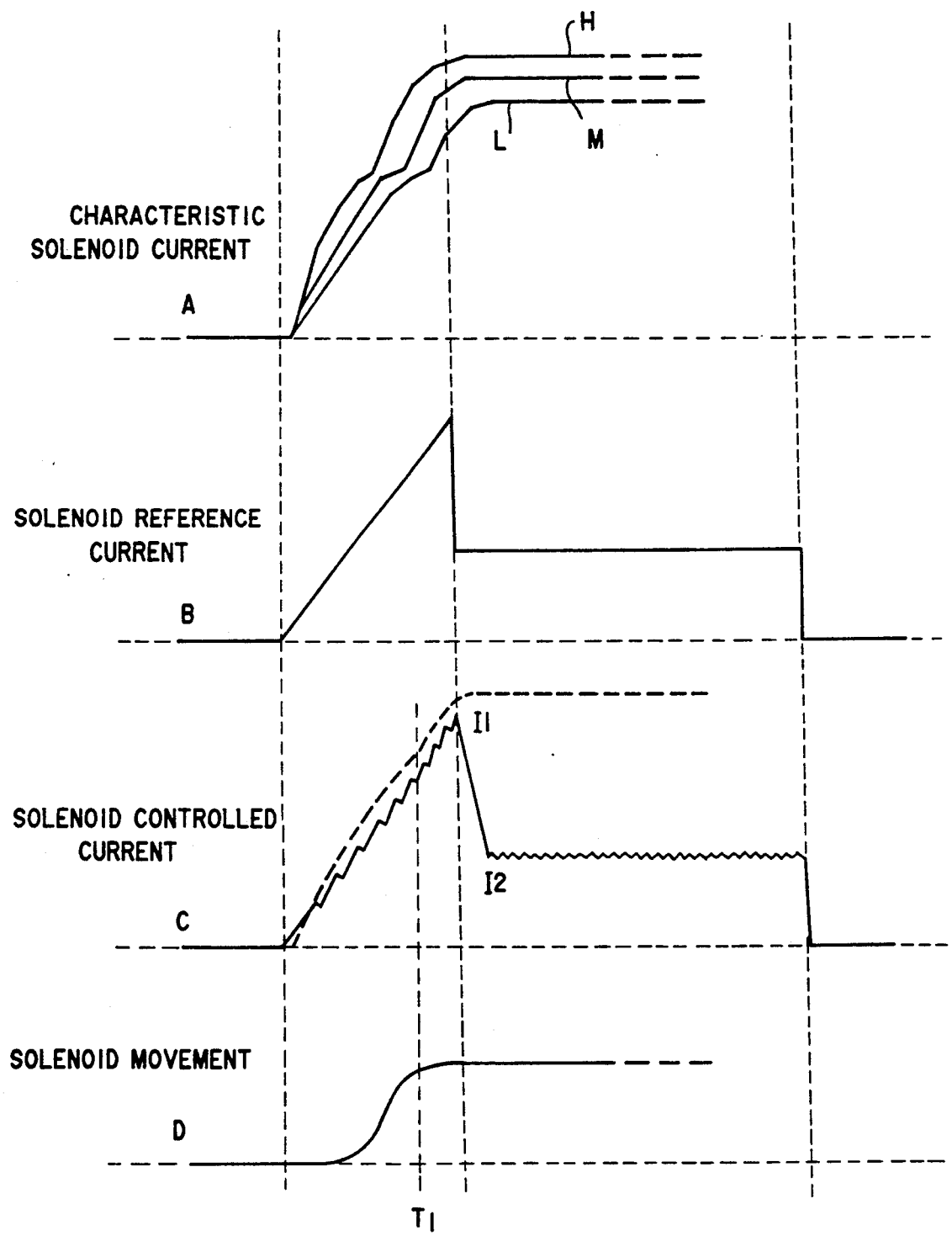
FIG. 1 is a series plot illustrating the functioning of a solenoid.

Referring now to FIG. 1 of the drawings there is shown a series of plots, Plot A showing variations in the current supplied to the solenoid plotted against time over the period from the initial connection of the electrical supply to the solenoid until the completion of the solenoid movement. The three plots represent supply at different voltages denoted, respectively, high voltage (H), low voltage (L) and medium voltage (M). It is clearly seen from these plots that the time taken for the current to rise to the value to effect the complete solenoid movement varies significantly with the supply voltage. This time variation gives rise to the problem of accurately timing the open period for a fuel injector nozzle controlled by a solenoid.

Plot B shows the theoretical ideal current-time relationship from initial switching on of the supply to the solenoid to open an injector nozzle to termination of the current to effect closing of the nozzle. It is to be noted that in this ideal situation, the current would rise linearly from the point of switch on to the solenoid completing the nozzle opening movement. Further, this linear rise of the current should be independent of any variation in the voltage of the current supply.

Plot C shows the actual current plotted against time through the full cycle of the solenoid movement from closed to fully open to closed again and incorporating the practise of the present invention. The current is supplied to the solenoid at a typical voltage as represented by the current plots shown in Plot A. It will be noted that there is incorporated in Plot C in broken outline the uncontrolled current characteristics that would be achieved without the use of the control as now proposed.

It will be noted that the current supplied to the solenoid is controlled, through the initial energising of the solenoid up to the point where the solenoid has completed its full movement, so that the rate of rise of the current corresponds to the ideal as represented in Plot B. This is achieved by varying the current between preset upper and lower values so as to achieve a mean current as represented in Plot B.

It will be noted that as the current approaches the maximum value, the rate of cycling of the current increases, this indicating that the solenoid has substantially completed its movement to the full open position of the injector nozzle as previously explained. Hence this increased rate of cycling of the current is an indication that the injector valve is fully open. This can be seen from Plot D, which shows the movement of the solenoid against time from current switch-on to time T1 indicating approximate full movement of the solenoid corresponds to the point of increase in the current cycling as seen in plot C.

Figure 2:
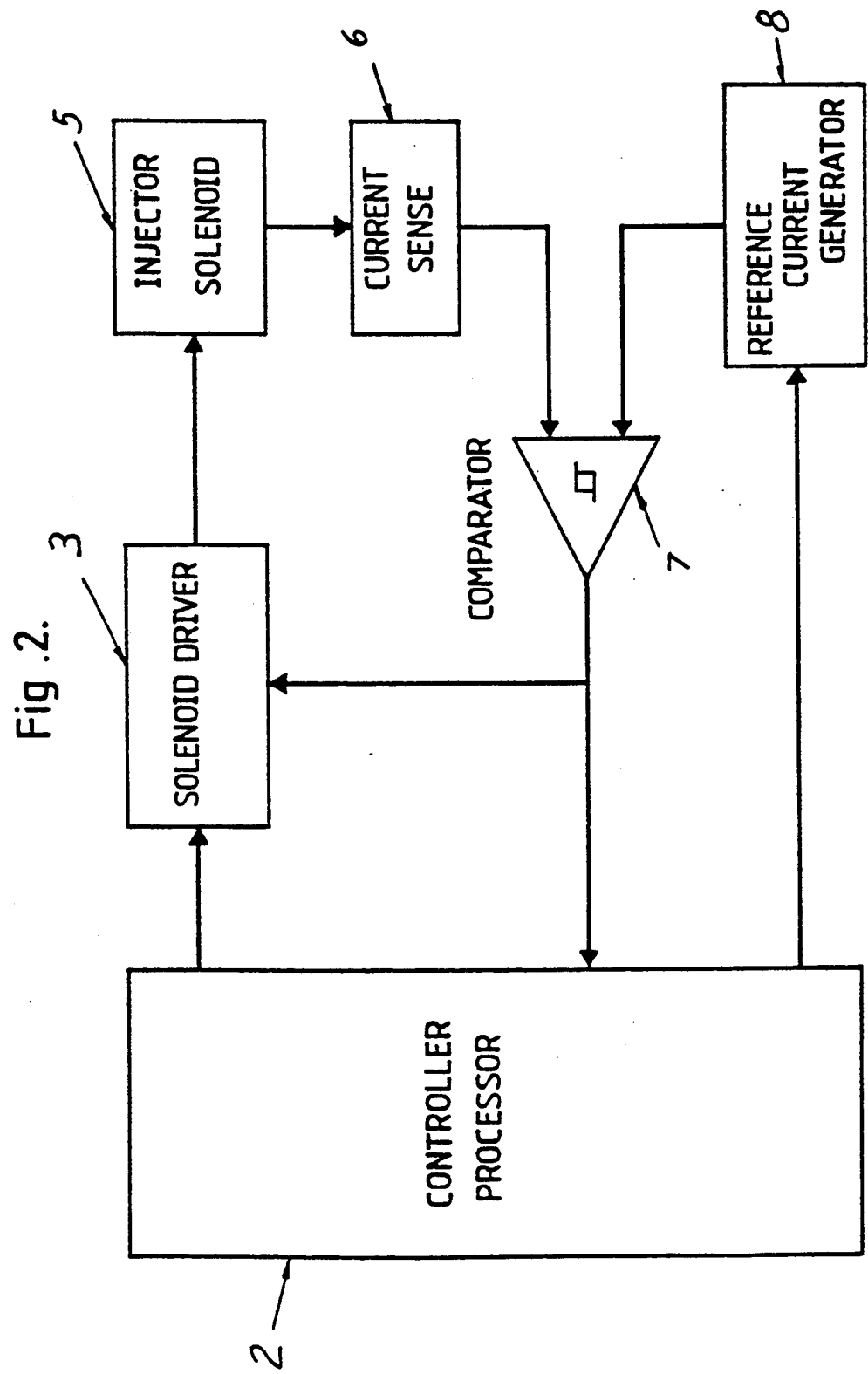
FIG. 2 is a block diagram of the method of controlling a solenoid.

Referring now to FIG. 2 of the drawings, there is shown in block diagram representing the power supply and control system for the solenoid of a fuel injector nozzle. The control processor 2 is of a known type as used for the control of an engine fuel injection system including the timing of the operation of a solenoid actuated injector nozzle of the engine fuel injection system.

The control processor 2 activates the solenoid driver 3 at the appropriate time in the engine cycle to cause the solenoid driver 3 to deliver the required current to activate the injector solenoid 5. The current sensor 6 detects the level of current flowing in the injector solenoid 5 and provides a signal to the comparator 7 indicative of the level of that current.

When the control processor 2 activates the solenoid driver 3, it also activates the reference current generator 8 which initiates the supply of the reference current to the comparator 7, that reference current being of a pre-set character such as shown in Plot B in FIG. 1. The comparator 7 compares the actual current in the solenoid with the reference current and provides an appropriate signal to the solenoid driver 3 so as to adjust the current supplied to the injector solenoid 5 to maintain a rate of rise of the current in accordance with the rate of rise determined by the reference current generator 7. This cycle repeats so as to produce a current supply to the injector solenoid 3 of the wave form shown in Plot C of FIG. 1, as indicated between points I0 and I1 on plot C.

Upon the current in the injector solenoid reaching I1, the solenoid driver 3 decays the current supply to the injector solenoid to a level I2 and maintains that level of current to the solenoid until the current supply is finally terminated by the control processor 2 at the end of the open period of the injector nozzle. The level of current I2 is maintained in a known manner by cycling the current between upper and lower limits.

The control processor 2 also receives a feed signal indicating the rate of cycling of the current to the injector solenoid and detects from this signal when the solenoid has completed its movement as previously referred to. The processor 2 measures the period that the injector nozzle is held open from the detection of this rate change. Accordingly the turn on delay of the injector nozzle can be accurately measured.

Figure 3:
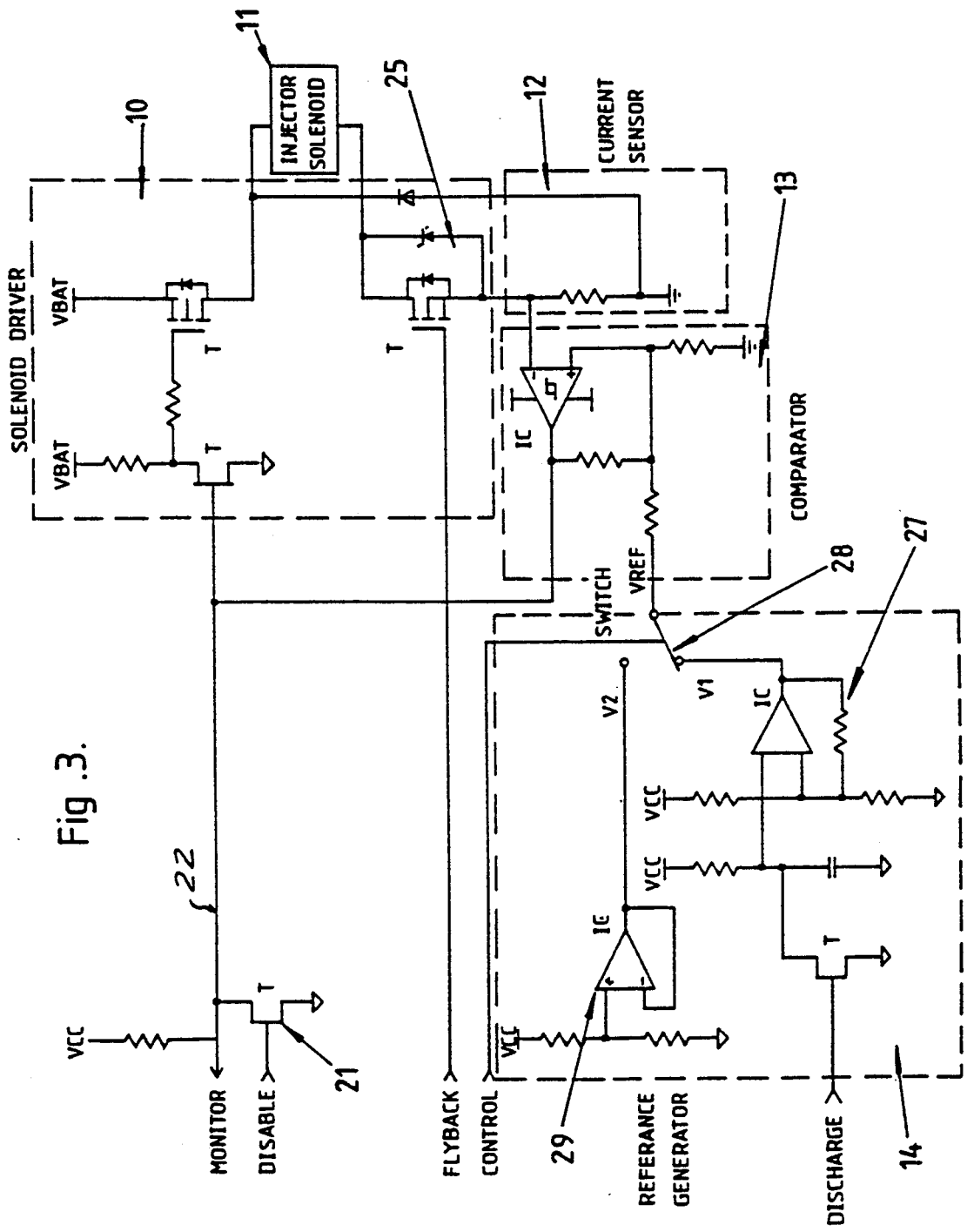
FIG. 3 is a simplified diagram of the solenoid control circuit.

Referring now to FIG. 3, there is shown a circuit diagram of one specific form of the driver, reference current generator and the comparator as may be used in the control of the solenoid current rise as previously discussed with respect to FIG. 2. The driver circuit 10 is of the conventional switchmode form and is activated from the control processor 2 (FIG. 2) through the enabler 21. The operation of the driver 10 is monitored by the control processor also. The driver provides the power to the injector solenoid 11. The driver 10 also includes a controlled Zener flyback 25 which operates when the solenoid 11 has effected its maximum travel to effect the rapid decay of the current supplied to the solenoid to the hold current I2, as indicated in Plot C of FIG. 1.

The current sensor 12 detects the current flowing to the solenoid 11 and provides an input to the comparator 13 which also receives the reference current from the pull-in reference current portion 27 of the reference current generator 14. The comparator 13 compares the input current to the solenoid as indicated by the current sensor 12 with the output from the reference current generator 14 and controls the operation of the switchmode driver to maintain the required rate of rise of the current supplied to the solenoid.

After sufficient time to allow the solenoid to effect full travel switch 28 is operated so that the output from the hold current portion 29 of the reference current generator 14 is supplied to the comparator 13 whereafter the required level of the hold current is supplied to the solenoid by the driver 10. This current control is maintained until the processor 2 determines that the injector nozzle open period has expired. The Zener flyback 25 is then again activated to rapidly decay the current supply to zero thereby the solenoid closes the injector nozzle.

During the period when the current supplied to the solenoid 11 is being controlled a characteristic of the frequency of the variation in the current or the voltage supplying the current is monitored by the control processor by input from the driver 10 via the line 22. As previously referred to this monitoring enables detection of when the solenoid has effected full movement.

The construction of a solenoid operated fuel injector has not been described herein as such injectors are in common use, particularly in vehicle engines. The construction of such injectors can be found in many U.S. patent specifications in Class 123. Typical patents are U.S. Pat. Nos. 4,841,942 and 4,844,339, the disclosure in each being hereby incorporated by reference in this specification.

I claim:

1. A method of controlling the operation of a solenoid comprising supplying current to the solenoid winding from an electrical source and controlling the rate of rise of the current at a predetermined rate during at least the period between initiation of the current supply and the commencement of movement of the solenoid armature, said predetermined rate of rise of the current being independent of the maximum rate of current rise attainable at the nominal voltage of the electrical source.

2. A method of controlling the operation of a solenoid operating the fuel delivery valve of a fuel injector of an internal combustion engine comprising supplying current to the solenoid winding from an electrical source and controlling the rate of rise of the current at a predetermined rate during at least the period between initiation of the current supply and the commencement of movement of the solenoid armature to open the delivery valve, said predetermined rate of rise of the current being independent of the maximum rate of current rise attainable at the nominal voltage of the electrical source.

3. A method as claimed in claim 1, wherein said rate of rise of the current is substantially linear over substantially the whole of said period between the initiating of the current supply and at least commencement of movement of the armature.

4. A method as claimed in of claim 1, wherein the rate of rise of the current is controlled until the solenoid has completed the movement to fully open the delivery valve.

5. A method as claimed in claim 1, wherein the rate of rise of the current is monitored and cyclically varied in response to said monitoring to maintain said predetermined rate of rise of the current.

6. A method as claimed in claim 1, wherein the rate of rise of the current is monitored and the supply voltage is cyclically varied in response to said monitoring to maintain said predetermined rate of rise of the current.

7. A method as claimed in claim 6, wherein the rate of rise of the current is monitored and the supply voltage is cyclically applied and disconnected in response to said monitoring to maintain said predetermined rate of rise of the current.

8. A method as claimed in claim 6, wherein said current is continuously compared with a reference current raising at said predetermined rate, and the supply voltage is cyclically varied in response to the said monitored current varying above or below said reference current by a preset amount.

9. A method as claimed in claim 8, wherein a reference current is generated during the period that the rate of rise of the current to the solenoid is to be controlled, the value of the solenoid current being monitored by comparison with the reference current during said period, and a control signal is generated in response to the difference between said reference current and solenoid current at the time of comparison to control the rate of current rise to the predetermined rate.

10. A method as claimed in claim 8, including monitoring a characteristic of the cyclic variations of the current, and thereby detecting when the frequency of said cycles substantially change indicating the delivery valve is fully open.

11. A method as claimed in claim 10, where the open period of the fuel delivery valve is measured from said substantial change in frequency.

12. Apparatus to control the operation of a solenoid operating the fuel delivery valve of a fuel injector of an internal combustion engine comprising an electrical energy source arranged to supply current to a solenoid winding in timed relation to the engine, and means to control the rate of rise of the current at a predetermined rate during the period between initiation of the current supply and at least commencement of movement of the solenoid armature to open the delivery valve, said predetermined rate of rise of the current being independent of the maximum rate of current rise attainable at the nominal voltage of said supply.

13. Apparatus as claimed in claim 12, wherein the control means is arranged so said rate of rise of the current is substantially linear over substantially the whole of said period between the initiating of the current supply and at least commencement of movement of the armature.

14. Apparatus as claimed in claim 12 wherein said means to control the current controls the rate of rise until the solenoid has completed the movement to fully open the delivery valve.

15. Apparatus as claimed in claim 12, including means to monitor the rate of rise of the current and means to cyclically vary the supply voltage in response to said monitoring to maintain said predetermined rate of rise of the current.

16. Apparatus as claimed in claim 15, wherein the monitoring means includes means to generate a reference current during the period that the rate of rise of the current to the solenoid is to be controlled, and means to compare the value of the solenoid current with the reference current during said period and generate a control signal in response to the difference between said reference current and solenoid current at the time of comparison to control the rate of current rise to the predetermined rate.

17. Apparatus as claimed in any one of claims 12, including means to monitor a characteristic of cyclic variations of the solenoid current to detect when the frequency of said cycles substantially changes.

18. Apparatus as claimed in claim 17, including means to terminate said control of the rate of rise of the current in response to the detecting of said frequency change.

19. Apparatus as claimed in claim 17, including means adapted to measure the open period of the fuel delivery valve from said frequency change.

* * * * *